US006822867B2

(12) United States Patent
Hsieh

(10) Patent No.: US 6,822,867 B2
(45) Date of Patent: Nov. 23, 2004

(54) ELECTRONIC ASSEMBLY WITH SOLDERABLE HEAT SINK AND METHODS OF MANUFACTURE

(75) Inventor: George Hsieh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/897,320

(22) Filed: Jun. 29, 2001

(65) Prior Publication Data

US 2003/0011997 A1 Jan. 16, 2003

(51) Int. Cl.$^7$ ................................................. H05K 7/20
(52) U.S. Cl. ....................... 361/704; 165/80.3; 165/185; 361/719; 29/890.035; 219/56.22; 176/16.3; 176/252
(58) Field of Search ................... 29/890.035; 219/56.22; 165/80.2, 80.3, 185; 176/16.3, 252; 257/706–707, 712–713, 718–719, 722, 726–727; 361/690, 704, 705, 707, 700, 708, 709–710, 715, 719–721

(56) References Cited

U.S. PATENT DOCUMENTS

| 4,602,315 | A | * | 7/1986 | Breese ........................ 361/709 |
| 4,605,058 | A | * | 8/1986 | Wilens ........................ 165/80.2 |
| 4,849,856 | A | * | 7/1989 | Funari et al. ................ 361/704 |
| 4,890,196 | A | | 12/1989 | Hinshaw et al. ............. 361/388 |
| 4,945,401 | A | * | 7/1990 | Trunk et al. ................. 257/718 |
| 5,311,395 | A | * | 5/1994 | Mcgaha et al. .............. 361/720 |
| 5,375,652 | A | | 12/1994 | Matsunaga et al. ......... 165/80.3 |
| 5,875,097 | A | * | 2/1999 | Amaro et al. ................ 361/704 |
| 5,901,781 | A | * | 5/1999 | Arai et al. ................... 361/704 |
| 5,926,371 | A | | 7/1999 | Dolbear ...................... 361/704 |
| 5,986,888 | A | * | 11/1999 | Amaro et al. ................ 361/704 |
| 6,068,051 | A | * | 5/2000 | Wendt ........................ 165/185 |
| 6,180,874 | B1 | | 1/2001 | Brezina et al. ............. 174/16.3 |
| 6,219,241 | B1 | * | 4/2001 | Jones ......................... 361/704 |
| 6,392,888 | B1 | | 5/2002 | Chen et al. ................. 361/704 |

FOREIGN PATENT DOCUMENTS

| JP | 10-189841 | * | 7/1998 |
| JP | 2000-138483 | | 5/2000 |

* cited by examiner

Primary Examiner—Gregory Thompson
(74) Attorney, Agent, or Firm—Schwegman, Lundberg, Woessner & Kluth, P.A.

(57) ABSTRACT

A electronic device and method for extracting heat from a heat producing component having front and back sides, the front side is disposed across from the back side, and the front side is attached to a substrate including multiple holes. A thermal interface material is disposed over the back side of the heat producing component. A heat sink including multiple pins corresponding to the multiple holes in the substrate is disposed over the thermal interface material such that the pins are disposed through the holes. The thermal interface material melts and wets to form a thermal coupling between the back side and the heat sink when passed over pre-heaters of a wave soldering machine. Further, the pins are soldered to form solder joints between the respective pins and the substrate when passed over a solder wave in the wave soldering machine to lock-in the thermal coupling formed during the preheating of the thermal interface material to provide a low-cost thermal solution.

40 Claims, 7 Drawing Sheets

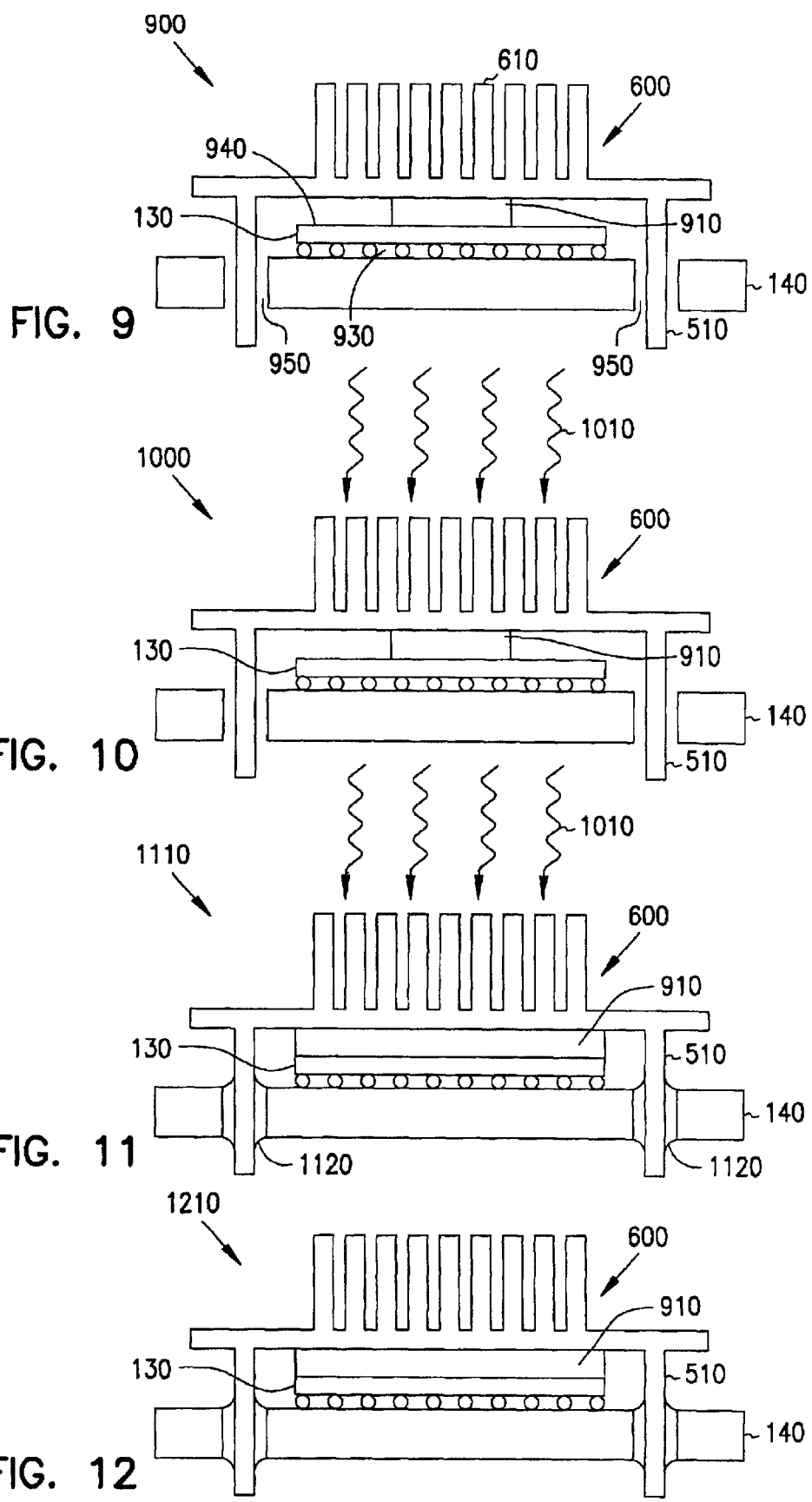

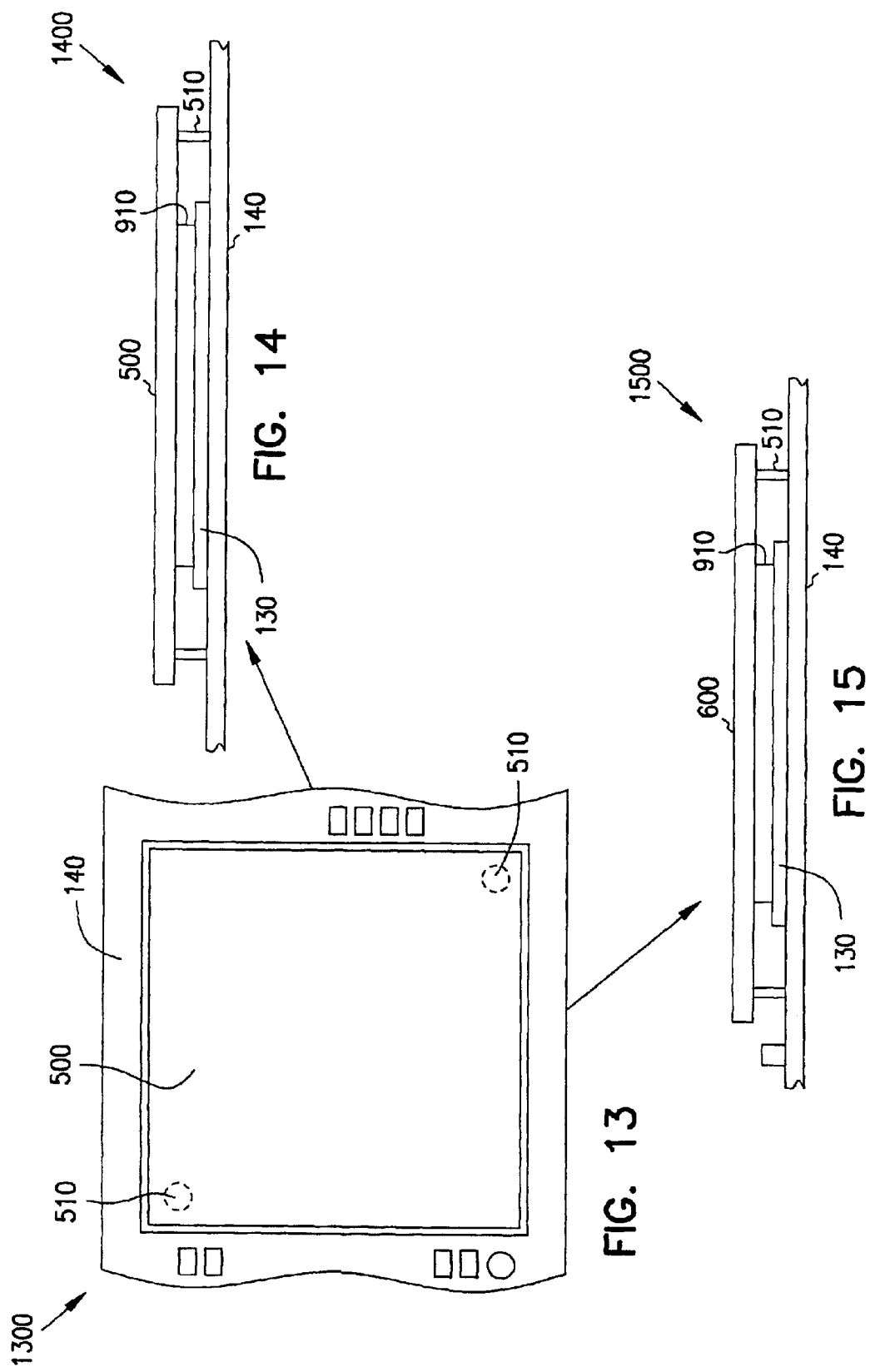

US 6,822,867 B2

ELECTRONIC ASSEMBLY WITH SOLDERABLE HEAT SINK AND METHODS OF MANUFACTURE

TECHNICAL FIELD

Embodiments of this invention relate generally to printed circuit boards and components coupled thereto and in particular, to an electronic assembly with solderable heat sinks and methods of manufacture.

BACKGROUND

Processors and related computer components are becoming more powerful with increasing capabilities, resulting in increasing amounts of heat dissipated from these components. Similarly, package and die sizes of the components are decreasing or remaining the same, which increases the amount of heat energy given off by the component for a given unit of surface area. Furthermore, as computer-related equipment becomes more powerful, more chips are surface-mounted to the printed circuit board, and more and more components are being placed inside the equipment or chassis which is also decreasing in size, resulting in additional heat generation in a smaller volume of space. Increased temperatures can potentially damage the components of the equipment, or reduce the lifetime of the individual components and equipment. In addition, some components are more susceptible to damage resulting from stress and strain occurring during testing, packaging, and use.

Heat sinks have been used to assist in dissipating heat from the processor and other heat-producing components within a housing. However, the overall size of the heat sink is limited by the volume constraints of the housing, and the footprint and/or the size constraints. Heat dissipation has been increased by using fasteners such as mechanical clips, epoxy, glue, and/or rivets which physically hold a heat sink to the processor package mounted on a printed circuit board. For some heat sinks, spring-loaded fasteners are used to couple the heat sink with the heat-producing components to enhance heat dissipation from the heat-producing components. However, such fasteners require one or more additional final assembly process steps, which results in requiring additional manufacturing resources after all of the soldering steps are completed. These additional manufacturing steps increase the cost of providing a thermal solution to heat-producing components such as chipsets.

FIGS. 1, 2, 3, and 4 illustrate conventional manners 100, 200, 300, and 400, respectively, of coupling the heat sink to heat-producing components such as chipsets and/or microprocessors. FIG. 1 illustrates using a mechanical clip 110 to couple heat sink 120 to heat-producing component 130 mounted on a printed circuit board 140 to enhance heat dissipation from the heat-producing component 130. FIG. 2 illustrates using epoxy and/or glue 210 to couple heat sink 120 to heat-producing component 130. FIG. 3 illustrates using spring-loaded fastener 310 to couple heat sink 120 to heat-producing component 130. FIG. 4 illustrates using rivets 410 to couple heat sink 120 to heat-producing component 130. All of these prior art techniques require one or more additional final assembly process steps, which increases the cost of providing a thermal solution to heat-producing components. In addition, the prior art techniques illustrated in FIGS. 1, 3, and, 4 require substantial circuit board space to mechanically retain the heat sink in place.

For the reasons stated above, and for other reasons stated below which will become apparent to those skilled in the art upon reading and understanding the present specification, there is a need in the art for a low-cost technique that consumes substantially less circuit board space than the prior art techniques to provide a low-cost thermal solution to the heat-producing components.

BRIEF DESCRIPTION OF THE DRAWINGS

FIGS. 9, 10, 11, and 12 illustrate a process for assembling an electronic assembly using the heat sinks shown in FIGS. 5, 6, 7, and 8 according to an embodiment of the present invention.

FIGS. 13, 14, and 15 illustrate an exemplary electronic assembly formed from the process shown in FIGS. 9, 10, 11, and 12.

DETAILED DESCRIPTION

Figure 1:
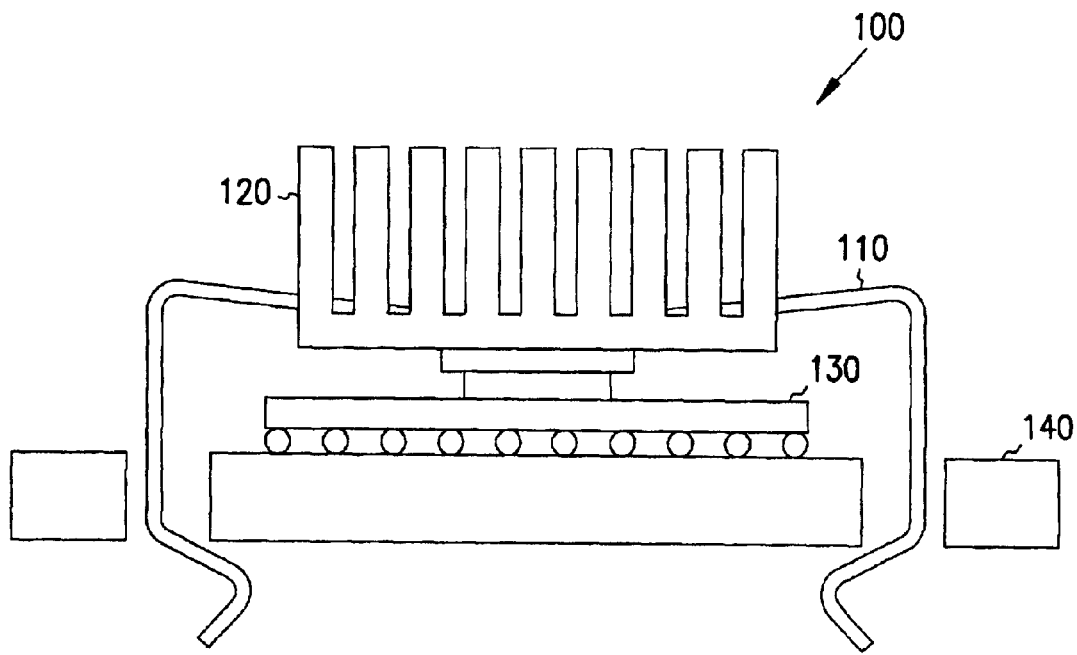
FIGS. 1, 2, 3, and 4 illustrate prior art techniques of coupling heat sinks to heat-producing components mounted on a printed circuit board.
Figure 2:
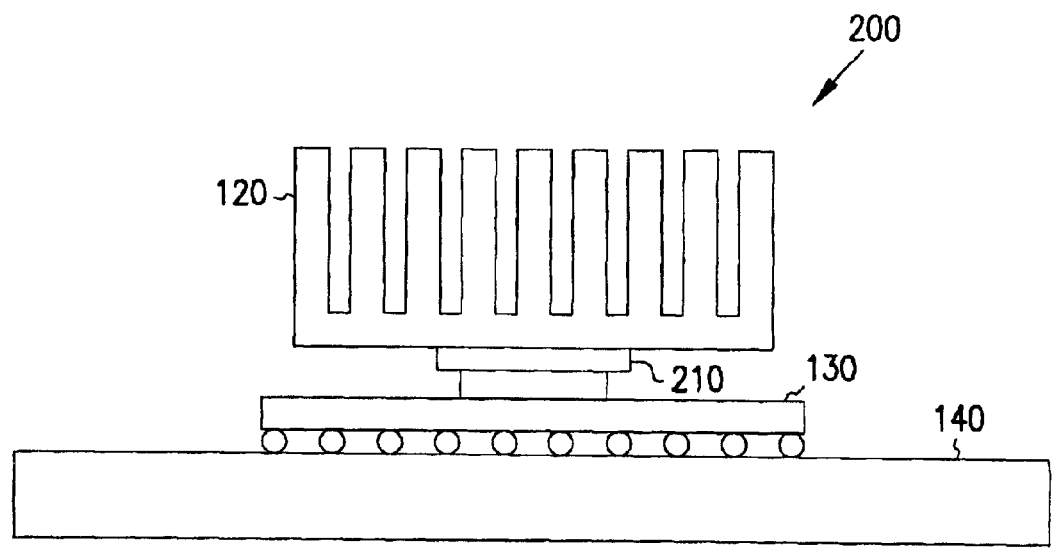
Figure 3:
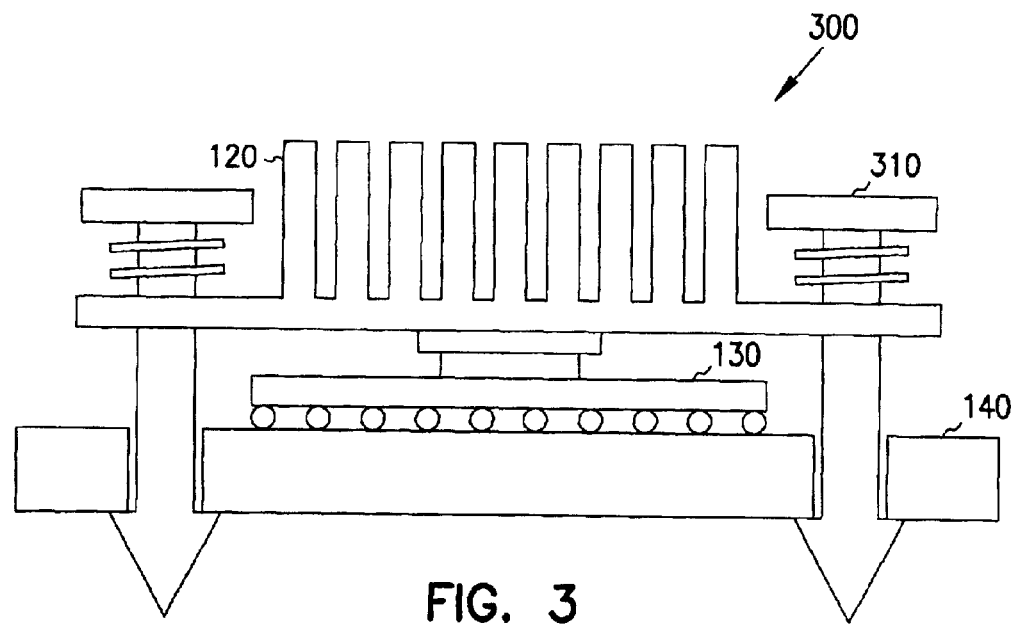
Figure 4:
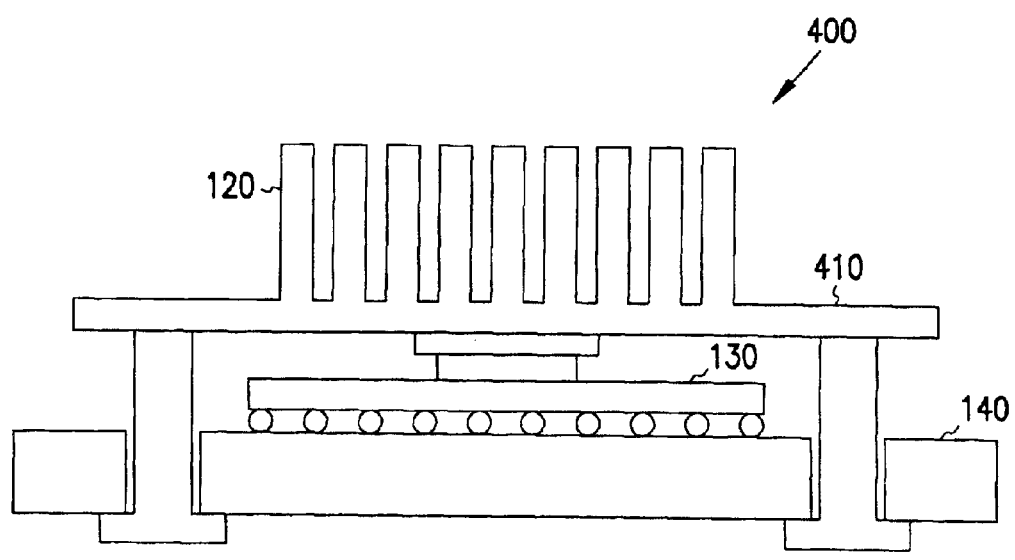

In the following detailed description of the embodiments, reference is made to the accompanying drawings that illustrate embodiments of the present invention and its practice. In the drawings, like numerals describe substantially similar components throughout the several views. These embodiments are described in sufficient detail to enable those skilled in the art to practice them. Other embodiments may be utilized, and structural, logical, and electrical changes may be made without departing from the scope of the present disclosure. Moreover, it is to be understood that the various embodiments of the invention, although different, are not necessarily mutually exclusive. For example, a particular feature, structure, or characteristic described in one embodiment may be included in other embodiments. The following detailed description is, therefore, not to be taken in a limiting sense, and the scope of embodiments of the present invention are defined only by the appended claims, along with the full scope of equivalents to which such claims are entitled.

This document describes, among other things, a low-cost technique that consumes less circuit board space than traditional means for providing a chipset thermal solution.

Figure 5:
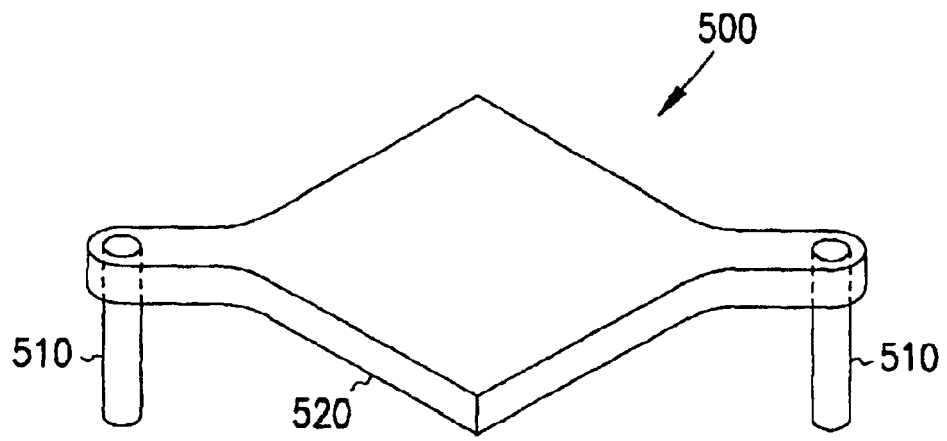
FIGS. 5, 6, 7, and 8 illustrate perspective views of different example embodiments of heat sinks according to the embodiments of the present invention.

FIGS. 5, 6, 7, and 8 illustrate perspective views of different example embodiments of heat sinks 500, 600, 700, and 800, respectively, according to embodiments of the present invention. FIG. 5 illustrates a perspective view of one example embodiment of a heat sink 500. As shown in FIG. 5, heat sink 500 includes two mounting pins 510 and a thermally conductive plate 520. In some embodiments, heat sink 500 can include at least one mounting pin. The mounting pins 510 are adapted to be disposed through corresponding mounting holes in a substrate (not shown) such that when heat sink 500 is thermally coupled to a heat-producing component (not shown), the mounting pins 510 are disposed through the holes for soldering the mounting pins 510 in the holes for mechanically attaching the heat sink 500 to a substrate during pre-assembly operation to provide a low-cost thermal solution. In some embodiments, the heat sink 500 can include multiple mounting pins and corresponding multiple mounting holes in the substrate.

In some embodiments, the mounting pins extend beyond the thermally conductive plate 520 such that the mounting pins 510 can be soldered when the thermally conductive plate 520 is thermally coupled to a heat-producing component. The heat sink 500 can be made from materials such as copper, aluminum, and other such materials suitable for dissipating the heat from a heat-producing component. In some embodiments, the mounting pins 510 can be soldered to the substrate using processes such as wave soldering, surface mount soldering, and other such soldering processes. In some embodiments, mounting pins can comprise two or more wave solderable pins.

Figure 6:
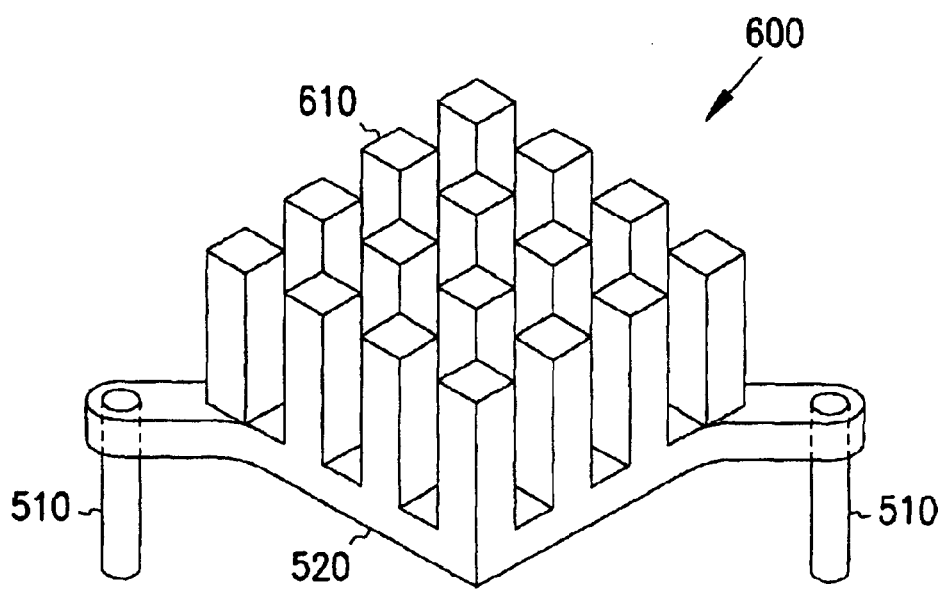

FIG. 6 illustrates a perspective view of another example embodiment of a heat sink 600 according to the present subject matter. The heat sink 600 shown in FIG. 6 is similar to heat sink 500 shown in FIG. 5 except that heat sink 600 shown in FIG. 6 further includes a heat exchange portion 610 disposed across from the mounting pins 510. In some embodiments, the heat exchange portion 610 includes multiple fins that extend upwardly beyond the thermally conductive plate 520.

Figure 7:
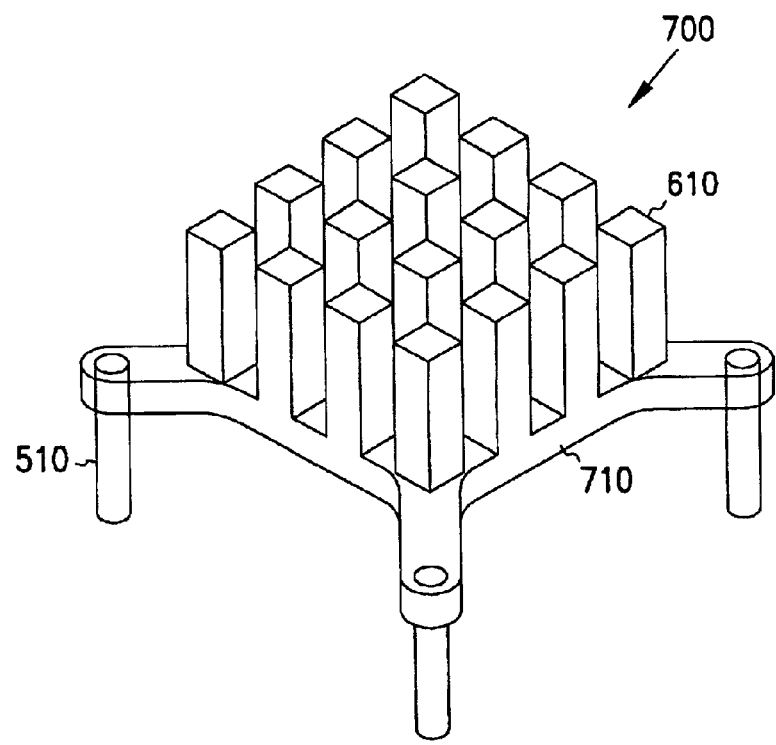
Figure 8:
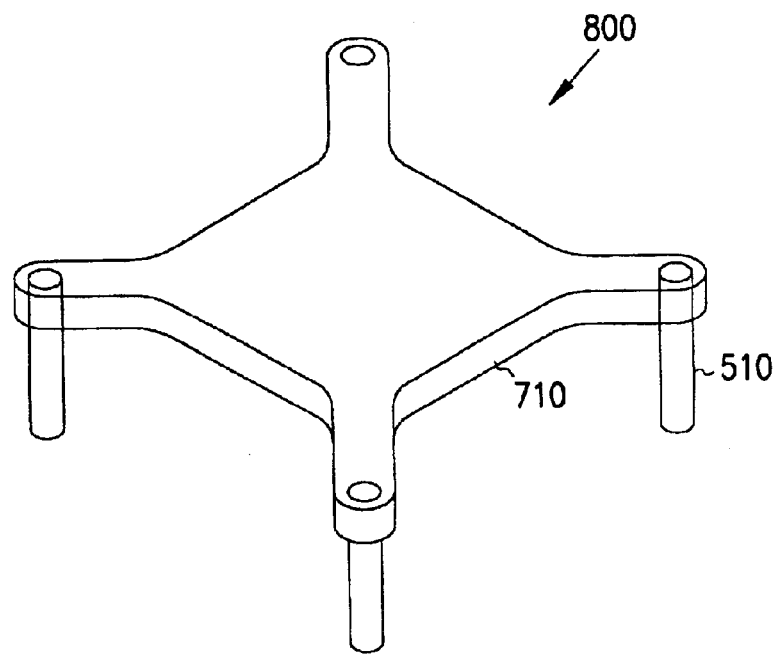

FIGS. 7 and 8 illustrate perspective isometric views of other example embodiments of heat sinks 700 and 800, respectively, according to the present subject matter. The heat sinks 700 and 800 are similar to heat sinks 500 and 600 shown in FIGS. 5 and 6, respectively, except that heat sinks 700 and 800 include four mounting pins instead of the two mounting pins shown in FIGS. 5 and 6. Also, the thermally conductive plate 710 is configured to include the four mounting pins as shown in FIGS. 7 and 8.

FIGS. 9, 10, 11, and 12 illustrate one example embodiment of process actions 900, 1000, 1110, and 1210, respectively, for attaching at least one heat-producing component 130 mounted on a printed circuit board 140 to a heat sink such as heat sink 600 shown in FIG. 6.

Action 900, as shown in FIG. 9, begins with mounting a front side 930 of the heat-producing component 130 to the printed circuit board (also referred to as a "substrate" herein) 140. The substrate 140 also includes multiple holes 950. In some embodiments, mounting the heat-producing component 130 includes electrically and/or mechanically coupling the component 130 to the substrate 140. The heat-producing component 130 includes integrated circuit devices such as a chipset, a microprocessor, a digital signal processor, and/or an application-specific integrated circuit device.

In addition, action 900 as shown in FIG. 9 also includes positioning a layer of thermal interface material 910 onto a back side 940 of the heat-producing component 130. The back side 940 of the heat-producing component 130 is disposed across from the front side 930. In some embodiments, thermal interface material 910 is either a phase change thermal interface material, such as Chomerics T725, Chomerics 705, Chomerics 710, and/or Chomerics 454, or a thermal grease such as Thermalloy TC1, Shinetsu G749, and/or Shinetsu G750. While the thermal greases, such as Shinetsu G749 and Shinetsu G750, are in liquid (viscous) form at room temperature, the phase change thermal materials, such as Chomerics T725, Chomerics 705, Chomerics 710, and Chomerics 454, are in a soft solid paste form at room temperature that melts with heating. These thermal interface materials melt at typical wave-soldering temperatures. Generally, the phase transition (changing from a paste-like state to a liquid state) temperatures of these phase change thermal interface materials are around 55° C.–65° C. Typically the ambient temperatures inside wave soldering machines (around the pre-heaters and the solder wave chambers) are well above 70° C. Temperatures above 70° C. are generally sufficient to melt the above-mentioned phase change thermal interface materials. Action 900 is compatible with use of either of the above-mentioned thermal interface materials.

Action 900, as shown in FIG. 9, further includes aligning heat sink 600 including at least one mounting pin 510 over the thermal interface material 910 and further through the corresponding at least one hole 950 in the substrate 140 so that the mounting pins 510 can be wave-soldered to the substrate 140. It can also be envisioned that the mounting pins 510 can be designed to be soldered to the substrate 140 using other circuit board assembly techniques, such as pin-in-paste, surface mount, and other methods suitable for attaching the heat sink 600 to the heat-producing component 130 during pre-assembly operations.

In some embodiments (refer to FIGS. 5 and 6), the heat sink 600 is formed to include a thermally conductive plate 520 such that the mounting pins 510 extend beyond the thermally conductive plate 520. In some embodiments, the heat sink 600 is formed to further include a heat exchange portion 610 (refer to FIG. 6), which extends outwardly from the plate 520. The heat exchange portion 610 is formed such that the heat exchange portion 610 is disposed across from (i.e. on an opposite side from) the heat-producing component. In some embodiments, forming the heat exchange portion 610 includes forming multiple fins that extend away from the thermally conductive plate 520. The heat sink 600 is made from materials such as copper, aluminum, and other such materials suitable for dissipating heat away from the heat source.

Action 1000, as shown in FIG. 10, includes reducing the viscosity of the thermal interface material 910 by preheating 1010 the thermal interface material 910 in a wave soldering pre-heater to cause the thermal interface material 910 to wet the heat-producing component 130 to thermally couple the heat sink 600 to the heat-producing component 130. In some embodiments, reducing the viscosity of the thermal interface material 910 further includes loading the substrate 140 including the heat-producing component 130, thermal interface material 910, and the heat sink 600 onto a conveyor of a wave soldering machine (not shown) and reducing the viscosity of the thermal interface material 910 by preheating (represented by wavy arrows 1010) the thermal interface material 910 disposed between the back side 940 of the heat-producing component 130 and the heat sink 600 such that the thermal interface material 910 melts and wets sufficiently the back side 940 and the heat sink 600 to provide sufficient thermal coupling between the heat-producing component 130 and the heat sink 600. In a typical wave soldering machine, the thermal interface material 910 will be exposed to temperatures of more than 70° C. for a period of 15 to 25 seconds over the pre-heaters, and further the thermal interface material 910 is exposed to temperatures above 80° C. for a period of 8–12 seconds when passing over a solder wave in the wave soldering machine. This is generally sufficient to melt the thermal interface material 910 and wet the back side 940 and the heat sink 600 to produce the necessary thermal coupling between the heat-producing component 130 and the heat sink 600. The above-mentioned exposure times and temperatures can be easily changed/adjusted in a typical wave-soldering machine to suit the requirements of a particular process.

Action 1110, as shown in FIG. 11, includes attaching the heat sink 600 in a fixed position onto the heat-producing component 130 and the substrate 140 by soldering the at least one mounting pin 510 to the substrate 140 while the thermal interface material 910 is still hot. In some embodiments, attaching the heat sink 600 in a fixed position includes placing the heat sink 600 in a fixed position onto the heat-producing component 130 and the substrate 140 by soldering the at least one mounting pin 510 to the substrate 140 to form solder joints 1120. Soldering the mounting pins 510 locks in the thermal coupling established by the wetting of the thermal grease 910 during the preheating to provide a low-cost thermal solution to the heat-producing component 130. In some embodiments, soldering the mounting pins 520 onto the substrate includes wave soldering the at least one mounting pin 510 to the substrate 140 to mechanically attach the heat sink 600 to the substrate 140.

Action 1210, as shown in FIG. 12, includes cooling the soldered mounting pins 510 to mechanically fix the heat sink 600 in place to form the solder joints 1120 and to further lock in the thermal coupling established between the back side 940 of the heat-producing component 130 and the heat sink 600 while the thermal interface material 910 is still hot.

FIGS. 13, 14, and, 15 illustrate a top view 1300, a side elevational view 1400, and a front elevational view 1500, respectively, of an electronic assembly including assembled substrate 140 and heat sink 500 thermally bonded to heat-producing component 130 using the process described with reference to FIGS. 9, 10, 11, and 12. The process of coupling the heat sink 500 to the heat-producing component 130 according to embodiments of the present invention is described in more detail with reference to FIGS. 9, 10, 11, and 12. It can be envisioned that more than one heat-producing component can be sandwiched between the substrate 140 and the heat sink 500 and further the heat sink 500 can be thermally bonded to more than one heat-producing component using the process described with reference to FIGS. 9, 10, 11, and 12. Although not shown in FIGS. 13, 14, and 15, it can be envisioned that an air movement device, such as a fan, can be mounted on the heat sink 500 to further enhance heat dissipation from the heat sink 500. In some embodiments, the heat-producing component 130 is an integrated circuit device such as a chipset, a microprocessor, a digital signal processor, and/or an application-specific integrated circuit device.

Figure 16:
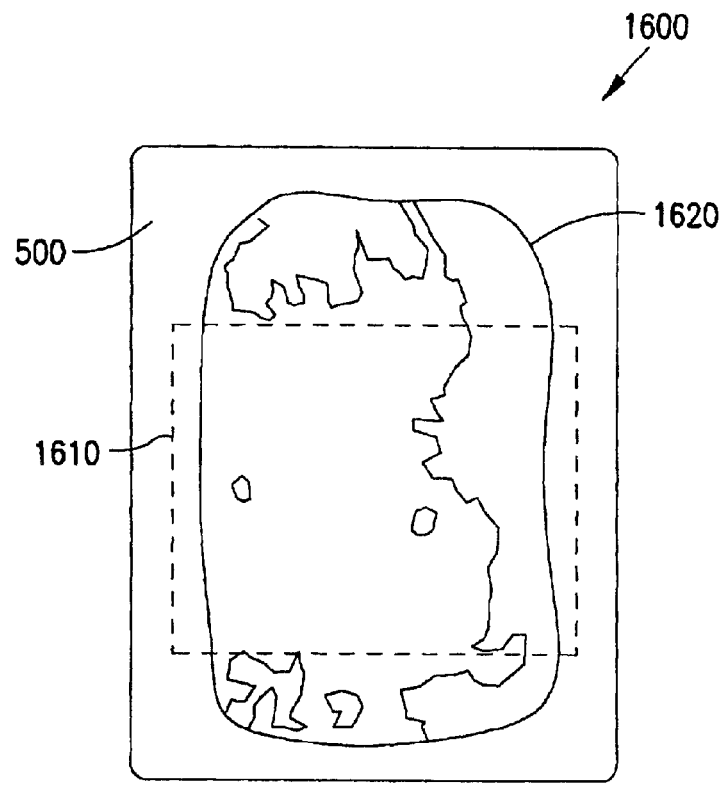
FIGS. 16 and 17 illustrate the coverage/wetting of a thermal interface material between a heat sink and a heat-producing component after passing through wave soldering pre-heaters.
Figure 17:
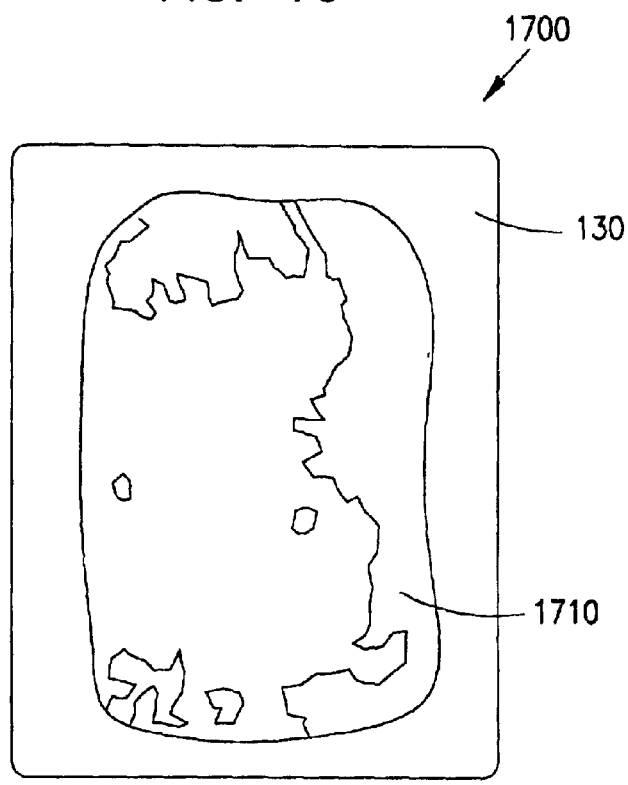

FIGS. 16 and 17 illustrate the coverage/wetting of thermal interface material between a heat sink 500 and a heat-producing component 130 after passing through wave soldering pre-heaters. FIG. 16 illustrates a view 1600 of the thermal interface material coverage 1620 on the underside of heat sink 500 after passing through the wave soldering pre-heaters. Also shown in FIG. 16 in dotted line is the outline of the original thermal interface material 1610 disposed between the heat sink 500 and the heat-producing component 130 before passing through the wave soldering pre-heaters. FIG. 17 illustrates a view 1700 of the thermal interface material coverage 1710 on the top side of heat-producing component 130 after passing through the wave soldering pre-heaters. It can be seen from FIGS. 16 and 17 that the thermal interface material 910 (refer to FIGS. 9-12) has completely wet the heat-producing component 130, and that the thermal interface material coverage 1620 and 1710, respectively, on the heat sink 500 (FIG. 16) and on the heat-producing component 130 (FIG. 17) has spread beyond the dashed outline of the originally disposed thermal interface material 1610 after passing through the wave soldering pre-heaters in a typical wave soldering machine.

CONCLUSION

The above-described method and device provides, among other things, a low-cost thermal solution by thermally coupling a heat producing component with a heat sink during the pre-assembly operation.

What is claimed is:

1. An electronic assembly system comprising:
    a substrate having at least one hole therein;
    a heat sink having at least one mounting pin;
    at least one heat-producing component attached to the substrate;
    a thermal interface material disposed between the heat sink and the heat-producing component;
    a heat source operatively coupled for a predetermined time to at least the at least one mounting pin to effect substantially simultaneous attachment of the at least one mounting pin to the substrate and attachment of the thermal interface material to the heat sink and to the heat-producing component;
    wherein the heat sink is disposed over the at least one heat-producing component and the substrate, wherein the heat-producing component is sandwiched between the substrate and the heat sink, wherein the thermal interface material is disposed between the heat sink and the heat-producing component to couple the heat sink to the heat-producing component, and wherein the at least one mounting pin of the heat sink is soldered into the at least one hole of the substrate.

2. The electronic assembly of claim 1, wherein the at least one mounting pin is straight and cylindrical and is wave-soldered to attach the heat sink to the substrate and to preheat and couple the heat sink to the heat-producing component with the disposed thermal interface material.

3. The electronic assembly of claim 1, wherein the heat sink further comprises:
    a thermally conductive plate, wherein the heat-producing component has front and back sides, the front side being disposed across from the back side, wherein the thermally conductive plate is coupled to the back side and the substrate is attached to the front side, and wherein the at least one mounting pin extends beyond the thermally conductive plate and the at least one mounting hole.

4. The electronic assembly of claim 3, wherein the heat sink further comprises:
    a heat exchange portion, wherein the heat exchange portion extends beyond the thermally conductive plate and is disposed across from the heat-producing component.

5. The electronic assembly of claim 4, wherein the heat exchange portion comprises:
    multiple fins extending away from the thermally conductive plate.

6. The electronic assembly of claim 3, wherein the thermal interface material is disposed between the heat sink and the back side of the heat-producing component.

7. The electronic assembly of claim 6, wherein the thermal interface material is selected from the group consisting of a phase change thermal interface material and a thermal grease.

8. The electronic assembly of claim 3, wherein the substrate is electrically and/or mechanically attached to the front side of the heat-producing component.

9. The electronic assembly of claim 1, wherein the heat sink is made from a material selected from the group consisting of copper and aluminum.

10. The electronic assembly of claim 1, wherein the heat-producing component is an integrated circuit device selected from the group consisting of a chipset, a microprocessor, a digital signal processor, and an application-specific integrated circuit device.

11. The electronic assembly of claim 1, wherein the substrate is a printed circuit board.

12. The electronic assembly of claim 1, wherein the at least one mounting pin is disposed in the at least one mounting hole and wave-soldered during a pre-assembly operation.

13. A method comprising:
   mounting a heat-producing component to a substrate having at least one hole therein;
   positioning a layer of thermal interface material onto the heat-producing component;
   aligning a heat sink including at least one mounting pin over the thermal interface material such that the thermal interface material is sandwiched between the heat-producing component and the heat sink, and further the at least one mounting pin is disposed over the substrate for soldering the at least one mounting pin to the substrate;
   reducing the viscosity of the thermal interface material by preheating the thermal interface material in a pre-heater of a wave soldering machine to cause the thermal interface material to wet the heat-producing component to thermally couple the heat sink to the heat-producing component; and
   attaching the heat sink in a fixed position on the heat-producing component and the substrate by soldering the at least one mounting pin into the at least one hole of the substrate and to substantially simultaneously heat the thermal interface material to produce the necessary thermal coupling between the heat producing component and the heat sink.

14. The method of claim 13, wherein reducing the viscosity of the thermal interface material comprises:
   loading the substrate including the heat-producing component, thermal interface material, and the heat sink onto a conveyor of the wave soldering machine; and
   preheating the thermal interface material using the pre-heater to cause the thermal interface material to wet the heat-producing component.

15. The method of claim 14, further comprising:
   cooling the at least one mounting pin to mechanically fix the heat sink in place.

16. The method of claim 13, wherein soldering the at least one mounting pin comprises:
   disposing the at least one mounting pin of the heat sink through the at least one hole in the substrate; and
   wave soldering the at least one mounting pin to the substrate.

17. The method of claim 13, further comprising:
   forming the heat sink including a thermally conductive plate such that the at least one mounting pin extends beyond the thermally conductive plate.

18. The method of claim 17, wherein forming the heat sink further comprises:
   forming a heat exchange portion such that the heat exchange portion extends beyond the thermally conductive plate and across from the heat-producing component.

19. The method of claim 18, wherein forming the heat exchange portion comprises:
   forming multiple fins extending away from the thermally conductive plate.

20. The method of claim 13 wherein, in aligning, the heat sink is made from a material selected from the group consisting of copper and aluminum.

21. The method of claim 13 wherein, in positioning, the thermal interface material capable of melting at a wave soldering preheat temperature is selected from the group consisting of a phase change thermal interface material and a thermal grease.

22. The method of claim 13, wherein mounting the heat-producing component to the substrate comprises:
   electrically and/or mechanically coupling the heat-producing component to the substrate.

23. The method of claim 13 wherein, in mounting, the heat-producing component is an integrated circuit device selected from the group consisting of a chipset, a microprocessor, a digital signal processor, and an application-specific integrated circuit device.

24. A method comprising:
   mounting a heat-producing component onto a substrate having at least one mounting hole therein;
   aligning a heat sink having at least one mounting pin to the substrate, with the at least one mounting pin inserted into the at least one mounting hole;
   positioning a thermal interface material between the heat-producing component and the heat sink; and
   using a wave soldering process to cause the thermal interface material to wet and bond to the heat sink and to the heat-producing component and to substantially simultaneously solder the at least one mounting pin to the at least one mounting hole.

25. The method of claim 24, further comprising:
   forming the heat sink to have a thermally conductive plate, wherein the at least one mounting pin extends beyond the thermally conductive plate.

26. The method of claim 25, wherein forming the heat sink further comprises:
   forming a heat exchange portion that extends beyond the thermally conductive plate and is disposed across from the heat-producing component.

27. The method of claim 26 wherein, in aligning, the heat sink is made from materials selected from the group consisting of copper and aluminum.

28. The method of claim 24 wherein, in positioning, the thermal interface material capable of melting at a wave soldering preheat temperature is selected from the group consisting of a phase change thermal interface material and a thermal grease.

29. The method of claim 24 wherein, in mounting, the heat-producing component is an integrated circuit device selected from the group consisting of a chipset, a microprocessor, a digital signal processor, and an application-specific integrated circuit device.

30. A method comprising:
   positioning a layer of thermal interface material on a heat sink having at least one mounting pin;
   mounting a heat-producing component to a substrate having at least one hole therein;
   aligning the heat sink over the heat-producing component such that the thermal interface material is sandwiched between the heat-producing component and the heat sink, and further such that the at least one mounting pin is disposed for soldering to the substrate;
   reducing the viscosity of the thermal interface material by preheating the thermal interface material in a pre-heater of a wave soldering machine to cause the thermal interface material to wet the heat-producing component to thermally couple the heat sink to the heat-producing component; and attaching the heat sink in a fixed position on the heat-producing component and the substrate by soldering the at least one mounting pin into the at least one hole of the substrate while continuing to heat the thermal interface material to produce the necessary thermal coupling between the heat producing component and the heat sink.

31. The method of claim 30, wherein reducing the viscosity of the thermal interface material comprises:

loading the substrate including the heat-producing component, thermal interface material, and the heat sink onto a conveyor of the wave soldering machine; and preheating the thermal interface material using the preheater to cause the thermal interface material to wet the heat-producing component.

32. The method of claim 31, further comprising:

cooling the at least one mounting pin to mechanically fix the heat sink in place.

33. The method of claim 30, wherein soldering the at least one mounting pin comprises:

disposing the at least one mounting pin of the heat sink through the at least one hole in the substrate; and wave soldering the at least one mounting pin to the substrate.

34. The method of claim 30, further comprising:

forming the heat sink including a thermally conductive plate such that the at least one mounting pin extends beyond the thermally conductive plate.

35. The method of claim 34, wherein forming the heat sink further comprises:

forming a heat exchange portion such that the heat exchange portion extends beyond the thermally conductive plate and across from the heat-producing component.

36. The method of claim 35, wherein forming the heat exchange portion comprises:

forming multiple fins extending away from the thermally conductive plate.

37. The method of claim 30 wherein, in aligning, the heat sink is made from a material selected from the group consisting of copper and aluminum.

38. The method of claim 30 wherein, in positioning, the thermal interface material capable of melting at a wave soldering preheat temperature is selected from the group consisting of a phase change thermal interface material and a thermal grease.

39. The method of claim 30, wherein mounting the heat-producing component to the substrate comprises:

electrically and/or mechanically coupling the heat-producing component to the substrate.

40. The method of claim 30 wherein, in mounting, the heat-producing component is an integrated circuit device selected from the group consisting of a chipset, a microprocessor, a digital signal processor, and an application-specific integrated circuit device.

* * * * *